United States Patent
Shih et al.

(10) Patent No.: US 11,264,391 B1
(45) Date of Patent: Mar. 1, 2022

(54) SEMICONDUCTOR STRUCTURE AND MANUFACTURING METHOD THEREOF

(71) Applicant: NANYA TECHNOLOGY CORPORATION, New Taipei (TW)

(72) Inventors: Chiang-Lin Shih, New Taipei (TW); Yu-Ting Lin, New Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 17/070,937

(22) Filed: Oct. 15, 2020

(51) Int. Cl.
*H01L 27/108* (2006.01)

(52) U.S. Cl.
CPC .. *H01L 27/10823* (2013.01); *H01L 27/10876* (2013.01)

(58) Field of Classification Search
None
See application file for complete search history.

(56) References Cited

U.S. PATENT DOCUMENTS

| 11,056,175 | B1* | 7/2021 | Ikeda | G11C 11/4023 |
| 2014/0231894 | A1 | 8/2014 | Parekh et al. | |
| 2015/0069479 | A1* | 3/2015 | Kajiyama | H01L 29/1095 257/295 |
| 2015/0132942 | A1* | 5/2015 | Kim | H01L 21/76224 438/618 |
| 2016/0204201 | A1* | 7/2016 | Oh | H01L 27/10814 257/330 |
| 2017/0330882 | A1 | 11/2017 | Wang et al. | |

* cited by examiner

Primary Examiner — Hsien Ming Lee
(74) Attorney, Agent, or Firm — CKC & Partners Co., LLC

(57) ABSTRACT

A semiconductor structure including silicon substrate, buried word lines, active areas, isolating areas, and nitride pillars is provided. The silicon substrate has a carrier surface. The buried word lines are buried in the silicon substrate. The active areas and the isolating areas are located on the carrier surface. The nitride pillars are disposed in the isolating areas respectively. The active areas and the isolating areas are arranged along a first direction. The buried word lines are extended along a second direction. The nitride pillars are located below the buried word lines in the isolating areas. A manufacturing method of semiconductor structure is also provided.

8 Claims, 10 Drawing Sheets

SEMICONDUCTOR STRUCTURE AND MANUFACTURING METHOD THEREOF

BACKGROUND

Field of Disclosure

The present invention relates to a semiconductor structure. More particularly, the present invention relates to a dynamic random access memory (DRAM) with buried word lines and a manufacturing method thereof.

Description of Related Art

A conventional DRAM cell includes a transistor and a capacitor coupled thereto. When density of the DRAM increases, the channel length of a traditional planar transistor is reduced, causing the short channel effects that include the drain-induced barrier lowering (DIBL), and so forth. Shrinking of the device size reduces the distance between word lines and bit lines, and eventually induces higher parasitic capacitance between such word lines and bit lines.

A buried word line (buried-WL) DRAM structure having word lines buried in the substrate is one of the solutions to deal with the problem. However, when the structure is further scaled down, depth of etching of shallow trench isolation (STI) will vary greatly, and eventually induces word line disturbance after buried word lines are formed.

SUMMARY

Accordingly, an embodiment of the present disclosure is directed to providing a semiconductor structure with buried word lines and a manufacturing method thereof.

According to an embodiment of the present disclosure, a semiconductor structure includes a silicon substrate, buried word lines, active areas, isolating areas, and nitride pillars. The silicon substrate has a carrier surface. The buried word lines are buried in the silicon substrate. The active areas and the isolating areas are located on the carrier surface. The nitride pillars are disposed in the isolating areas respectively. The active areas and the isolating areas are arranged along a first direction. The buried word lines are extended along a second direction. The nitride pillars are located below the buried word lines in the isolating areas.

In an embodiment of the present disclosure, top surfaces of the nitride pillars are aligned with bottom surfaces of the buried word lines in the active areas.

In an embodiment of the present disclosure, in the first direction, width of every nitride pillars is smaller than width of the buried word line in the active area.

In an embodiment of the present disclosure, in the first direction, width of bottom surface of each of the buried word lines above the nitride pillars is smaller than width of each of the buried word lines in the active areas.

In an embodiment of the present disclosure, in each of the buried word lines, top surfaces of the nitride pillars are aligned with top surface of the silicon substrate.

According to an embodiment of the present disclosure, a manufacturing method of semiconductor structure includes: etching second trenches on a carrier surface of a silicon substrate along a second direction; disposing nitride structure in each of the second trenches; etching a plurality of first trenches on the silicon substrate along the second direction and etching the nitride structures into a plurality of nitride pillars; and disposing a plurality of buried word lines. Some of the buried word lines are located in the first trenches respectively. The rest of the buried word lines are located above the nitride pillars respectively.

In an embodiment of the present disclosure, the manufacturing method further includes disposing an oxide layer in the second trenches in conformal manner before disposing the nitride structures.

In an embodiment of the present disclosure, the step of disposing the nitride structures includes: disposing a plurality of nitride strips extending along a first direction; and etching the nitride strips into the nitride structures using a first hard mask. The first hard mask exposes the second trenches.

In an embodiment of the present disclosure, bottom surface of the first trenches on the silicon substrate and top surfaces of the nitride structures are aligned.

In an embodiment of the present disclosure, top surfaces of the nitride structures are aligned with the carrier surface of the silicon substrate.

As seen above, in the semiconductor structure of the embodiment of the disclosure, the nitride pillars below the buried word lines can further prevent word line disturbance. The manufacturing method of the embodiment of the disclosure can provide a semiconductor structure without word line disturbance.

The foregoing has outlined rather broadly the feature and technical advantages of the present disclosure in order that the detailed description of the disclosure that follows may be better understood. Additional features and technical advantages of the disclosure are described hereinafter, and form the subject of the claims of the disclosure. It should be appreciated by those skilled in the art that the concepts and specific embodiments disclosed may be utilized as a basis for modifying or designing other structures, or processes, for carrying out the purpose of the present disclosure. It should also be realized by those skilled in the art that such equivalent constructions do not depart from the spirit or scope of the disclosure as set forth in the appended claims.

It is to be understood that both the foregoing general description and the following detailed description are by examples, and are intended to provide further explanation of the invention as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

Figure 1:
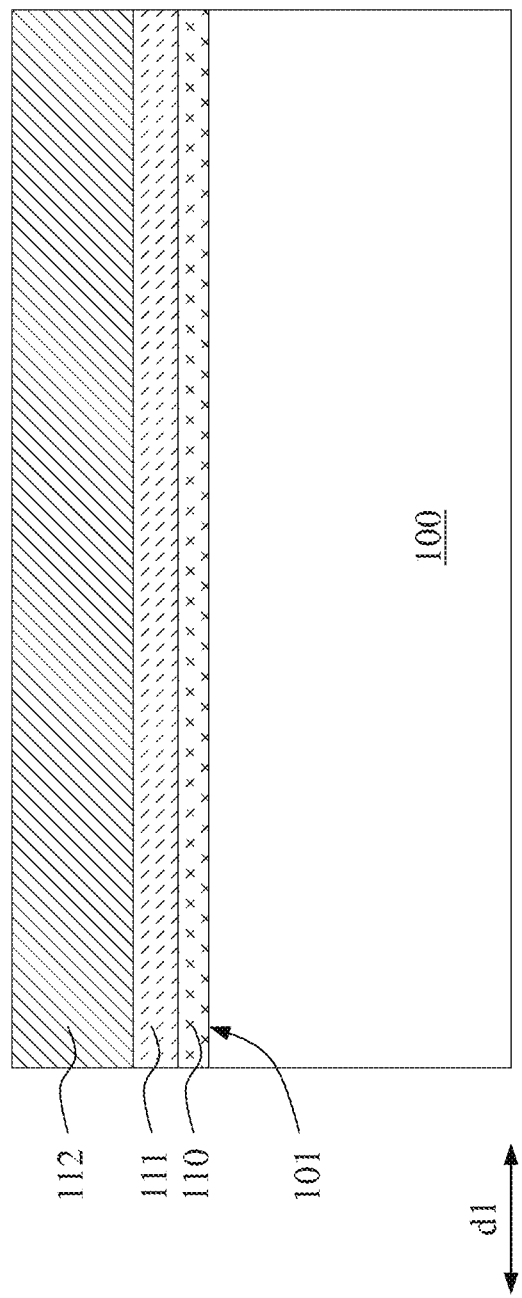
FIGS. 1 to 10 are schematic sectional views of intermediate stages of a method of manufacturing a DRAM according to an embodiment of the present disclosure.

Reference will now be made in detail to the present embodiments of the invention, examples of which are illustrated in the accompanying drawings. Wherever possible, the same reference numbers are used in the drawings and the description to refer to the same or like parts.

Referring to the drawings, the illustrated thickness of the layers and regions may be exaggerated to facilitate explanation. When a first layer is referred to as being "on" a second layer or "on" a substrate, it could mean that the first layer is formed directly on the second layer or the substrate, or it could also mean that a third layer may exist between the first layer and the second layer or the substrate.

It shall be understood that, although the terms first, second, third, etc. may be used herein to describe various elements, components, regions, layers, or sections, these elements, components regions, layers, or sections are not limited by these terms. Rather, these terms are merely used to distinguish one element, component, region, layer, or section from another region, layer or section. Thus, a first element, component, region, layer, or section discussed below could be termed a second element, component, region, layer, or section without departing from the teachings of the present disclosure.

The terminology used herein for the purpose of describing particular embodiments only and is not intended to be limited to the present disclosure concept. As used herein, the singular forms "a", "an" and "the" are intended to include the plural forms as well, unless the context clearly indicates otherwise. It shall be further understood that the terms "comprises" and "comprising", when used in the specification, point out the presence of stated features, integers, steps, operations, elements, or components, but do not preclude the presence or addition of one or more other features, integers, steps, operations, elements, components, or groups thereof.

As used herein, the terms "patterning" and "patterned" are used in the present disclosure to describe an operation of forming a predetermined pattern on a surface. The patterning operation includes various steps and processes and varies in accordance with different embodiments. In some embodiments, a patterning process is adopted to pattern an existing film or layer. The patterning process includes forming a mask on the existing film or layer and removing the unmasked film or layer with an etch or other removal process. The mask can be a photoresist, or a hard mask. In some embodiments, a patterning process is adopted to form a patterned layer directly on a surface. The patterning process includes forming a photosensitive film on the surface, conducting a photolithography process, and performing a developing process. The remaining photosensitive film is retained and integrated into the semiconductor device.

Semiconductor structure of an embodiment of the present disclosure can be utilized in a DRAM. FIGS. 1 to 10 are schematic sectional views of intermediate stages of a method of manufacturing a DRAM according to an embodiment of the present disclosure, and FIGS. 1 and 3 to 9 are taken along the first direction d1, and FIGS. 2 and 10 are taken along the second direction d2, and the first direction d1 is parallel to extending direction of active areas of the DRAM, and the second direction d2 is parallel to buried word lines of the DRAM.

Figure 2:
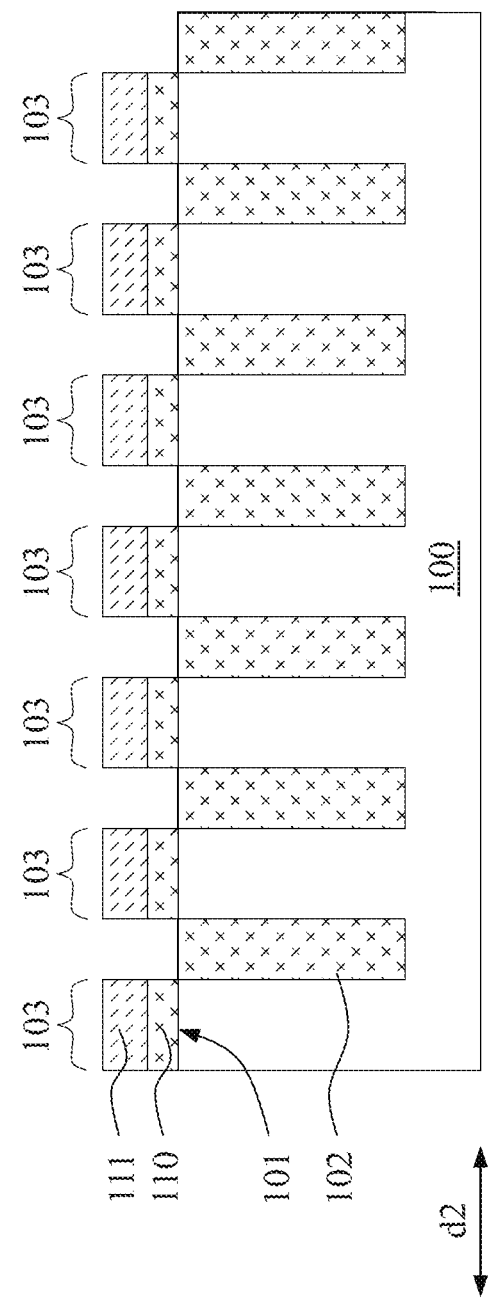

Please refer to FIG. 1. According to the embodiment of the present disclosure, the manufacturing method includes an operation in which a silicon substrate 100 is provided. The silicon substrate 100 has a carrier surface 101.

For example, in the embodiment, an oxide layer 110 and a nitride layer 111 are disposed on the carrier surface 101 of the silicon substrate 100, and the oxide layer 110 is located between the silicon substrate 100 and the nitride layer 111. Furthermore, a photoresist layer 112 is disposed on the nitride layer 111.

Please refer to FIG. 2. The photoresist layer 112 is patterned, and the method of the present disclosure further includes an operation in which the silicon substrate 100 is etched and a plurality of oxide structures 102 are disposed. In other words, the oxide structures 102 in the silicon substrate 100 form a plurality of shallow trench isolation (STI). After the etching operation, a plurality of first areas 103 are formed among the oxide structures 102.

Figure 3:
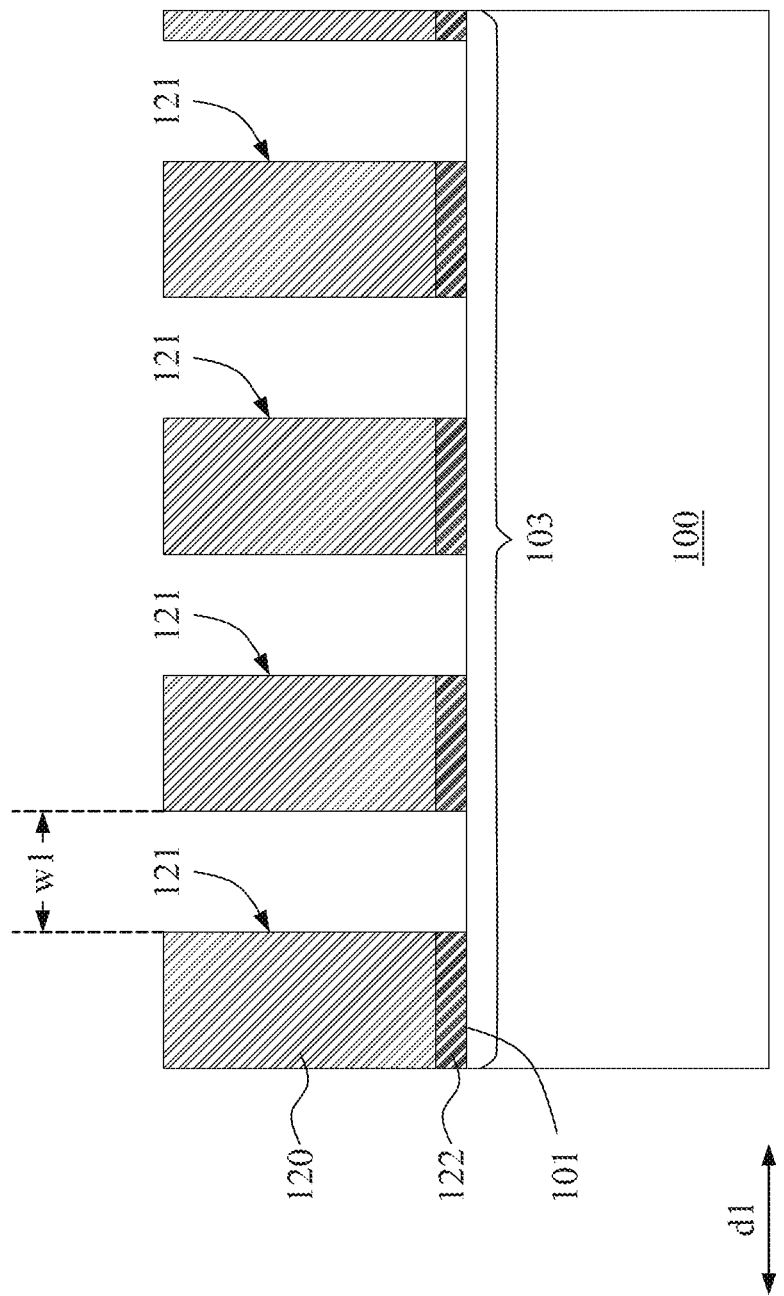

Please refer to FIG. 3. The manufacturing method of the present disclosure removes the oxide layer 110 and the nitride layer 111 above every first area 103 as shown in FIG. 2, and a first hard mask 120 is disposed on the carrier surface 101 of the first area 103 of the silicon substrate 100. In the embodiment, the first hard mask 120 has a plurality of first openings 121.

Moreover, in the first direction d1, each of the first openings 121 has a width w1. For example, the width w1 in the embodiment is about 24 nm, but the disclosure is not limited thereto. In some embodiment, the width w1 may ranges from about 23 nm to about 25 nm.

To be specific, in the embodiment, while disposing the first hard mask 120 on the silicon substrate 100, the first area 103 remains uncut. The first openings 121 of the first hard mask 120 overlap the first area 103.

For example, in the embodiment, each of the first area 103 is exposed by more than one first openings 121. Moreover, an etch hard mask layer 122 is disposed between the first hard mask 120 and the carrier surface 101 of the silicon substrate 100 for silicon etch. The distribution area of the first hard mask 120 on the carrier surface 101 and the distribution area of the etch hard mask layer 122 on the carrier surface 101 are substantially the same.

In the embodiment, material of the first hard mask 120 may be TEOS oxide, and material of the etch hard mask layer 122 may be nitride with silicon, but the present disclosure is not limited thereto.

Figure 4:
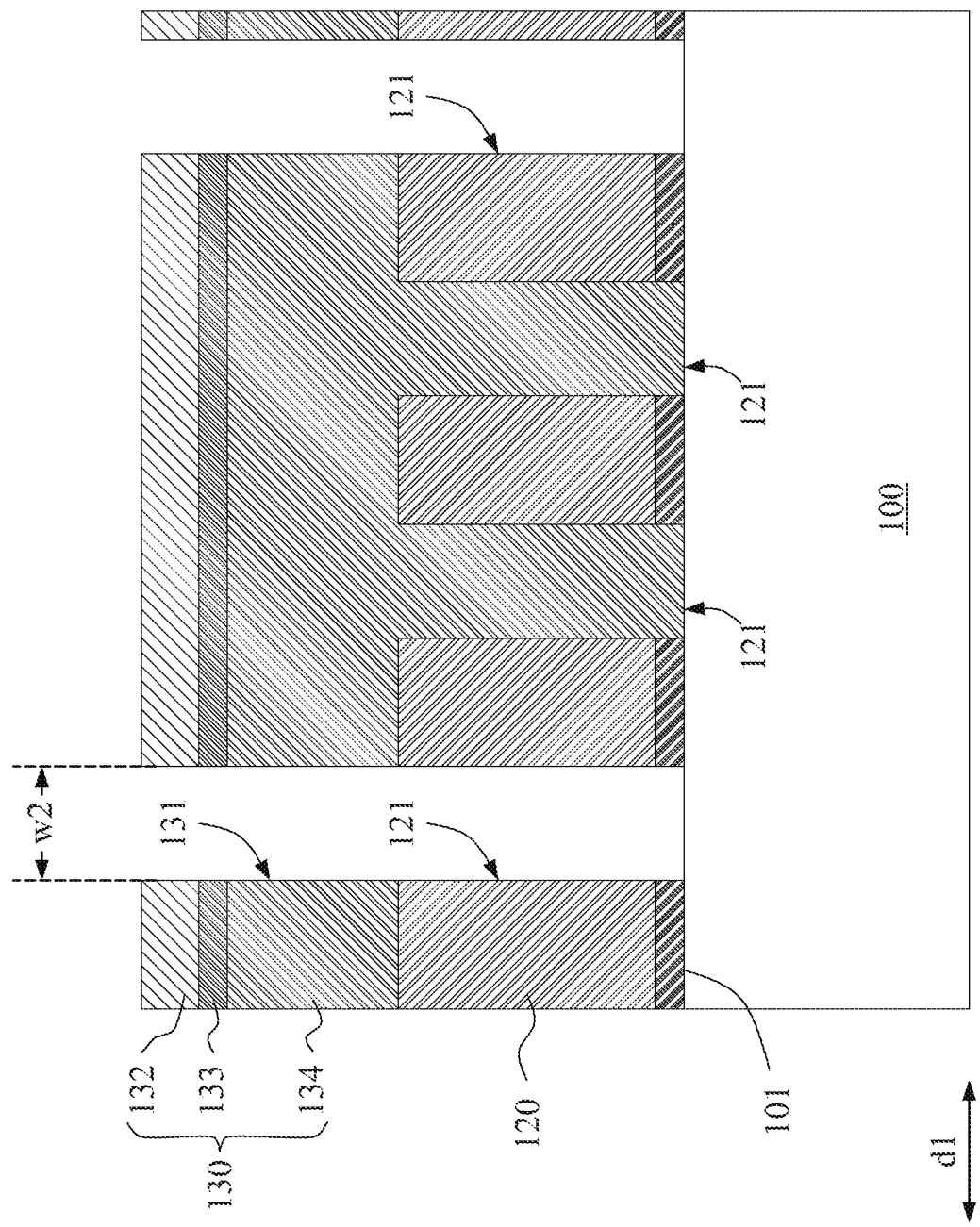

Please refer to FIG. 4. In the embodiment, a second hard mask 130 is disposed on the first hard mask 120. To be specific, the second hard mask 130 is disposed on the silicon substrate 100 carrying the first hard mask 120, and some of the first openings 121 are filled with the second hard mask 130.

The second hard mask 130 has a plurality of second openings 131, and each of the second openings 131 is aligned with one of the first openings 121 of the first hard mask 120. In other words, each of the second openings 131 exposes one of the first openings 121 of the first hard mask 120.

For example, in the embodiment, the second hard mask 130 has an oxide layer 132, a silicon layer 133, and an under layer 134. The under layer 134 includes organic material for gap fill & uniformity. Each of the second openings 131 goes through the oxide layer 132, the silicon layer 133, and the under layer 134, and is aligned with one of the first opening 121. Some of the first openings 121 are filled with the under layer 134.

Moreover, in the first direction d1, each of the second openings 131 also have the width w2, which is ranged from about 39 nm to about 43 nm, such as 41 nm. To be specific, in the first direction d1, width w2 of the first opening 121 and width w2 of the second opening 131 could be the same, but the disclosure is not limited thereto. In other embodiments of the present disclosure, the width of the second openings 131 could be larger than the width of the first openings 121 in the first direction d1.

Figure 5:
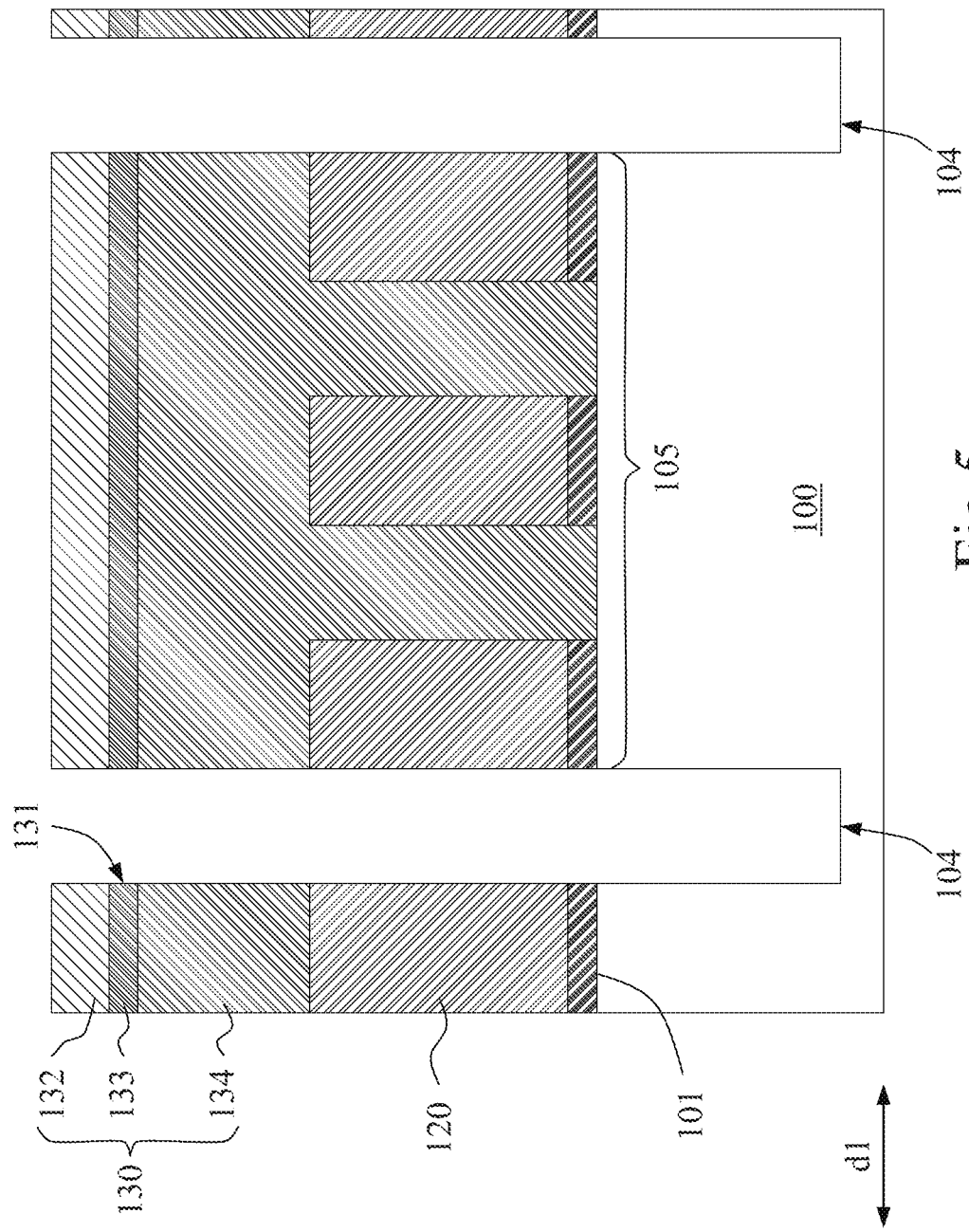

Please refer to FIG. 5. The manufacturing method of the present disclosure etches a plurality of second trenches 104 on the carrier surface 101 of the silicon substrate 100 along the second direction d2 as shown in FIG. 2.

The silicon substrate 100 is etched using the second hard mask 130, and the second trenches 104 are formed. To be specific, the etching removes parts of the silicon substrate 100 exposed by the second hard mask 130. Also, the etching cuts the first area 103 as shown in FIG. 3 into a plurality of active areas 105.

Figure 6:
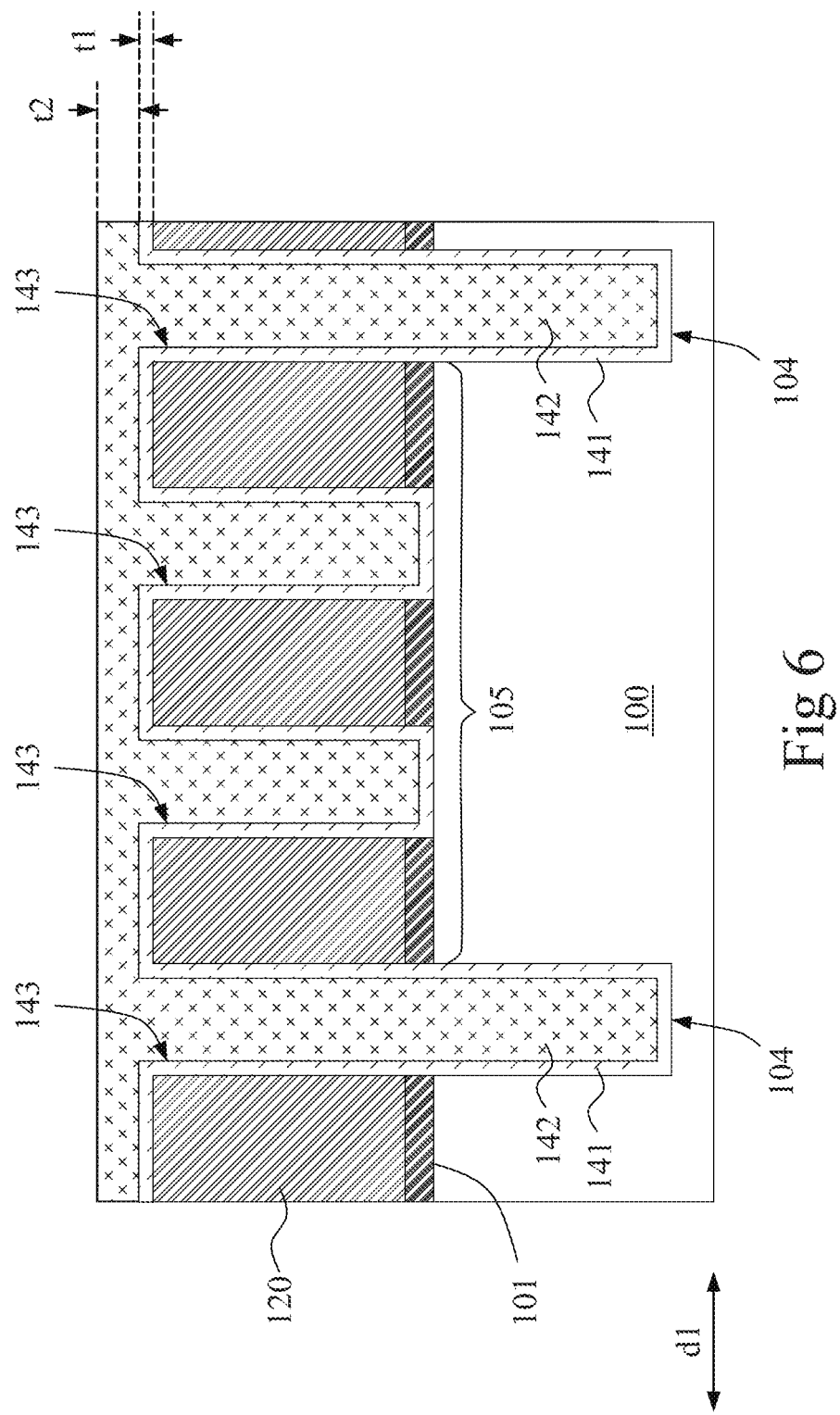
Figure 7:
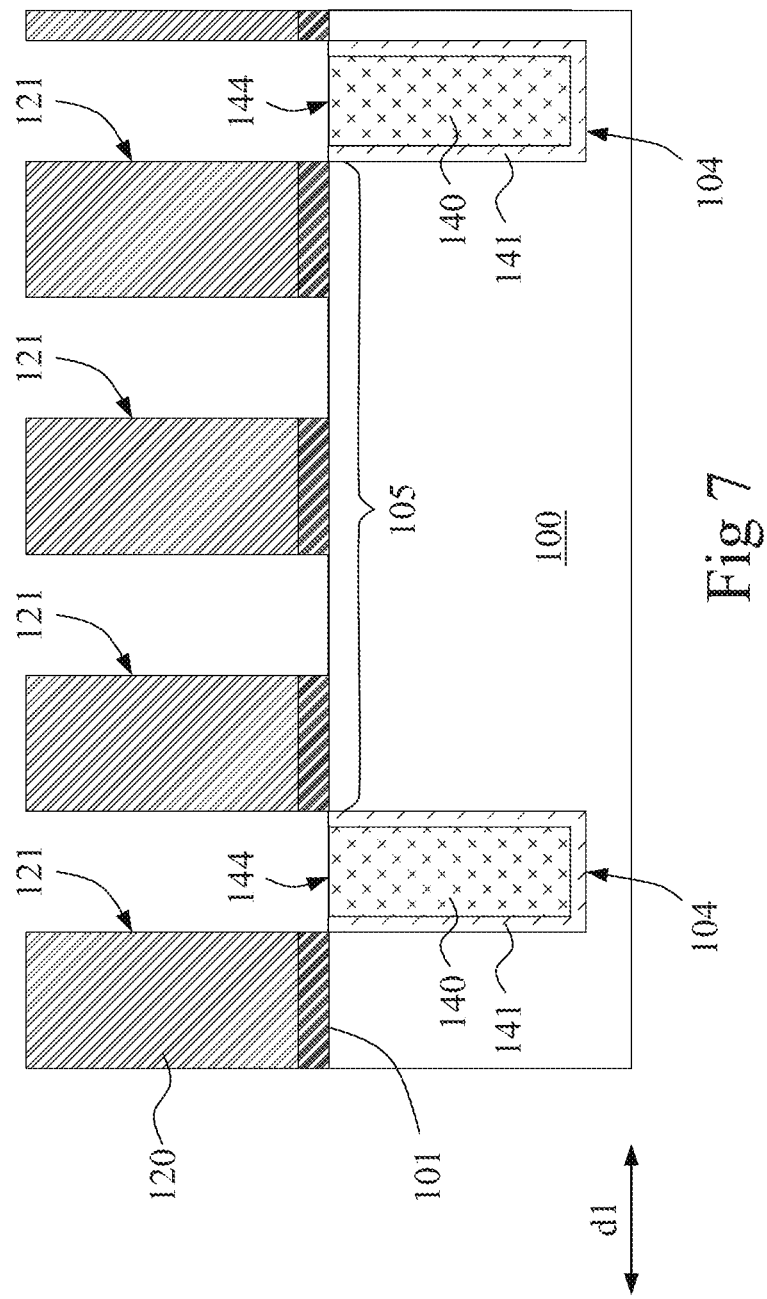

Please refer to FIG. 6 and FIG. 7. The manufacturing method of the present disclosure removes the second hard mask 130, and disposes nitride structures 140 in each of the second trenches 104.

To be specific, as shown in FIG. 6, an oxide layer 141 is disposed in the second trenches 104 in conformal manner, and a nitride strip 142 is disposed on the oxide layer 141. The nitride strip 142 is extended along the first direction d1. Moreover, the oxide layer 141 and the nitride strip 142 further covers the first hard mask 120, while top surfaces of the nitride strip 142 and the oxide layer 141 are above top surface of the first hard mask 120.

Also, the oxide layer 141 forms a plurality of oxide openings 143, and the nitride strip 142 is filling the oxide openings 143. For example, in the embodiment, thickness t1 of the oxide layer 141 is about 11 nm, and the thickness t2 of the nitride strip 142 above the first hard mask 120 is about 24 nm.

Please refer to FIG. 7. The manufacturing method of the present disclosure etches the nitride strip 142 into the nitride structures 140 using the first hard mask 120. Since the first hard mask 120 exposes the second trenches 104, the nitride structures 140 are remained in the second trenches 104. Moreover, some of the oxide layer 141 is also remained between the second trenches 104 and the nitride structures 140.

In the embodiment, top surfaces 144 of the nitride structures 140 are aligned with the carrier surface 101 of the silicon substrate 100, and the carrier surface 101 of the silicon substrate 100 in the active area 105 is exposed.

Figure 8:
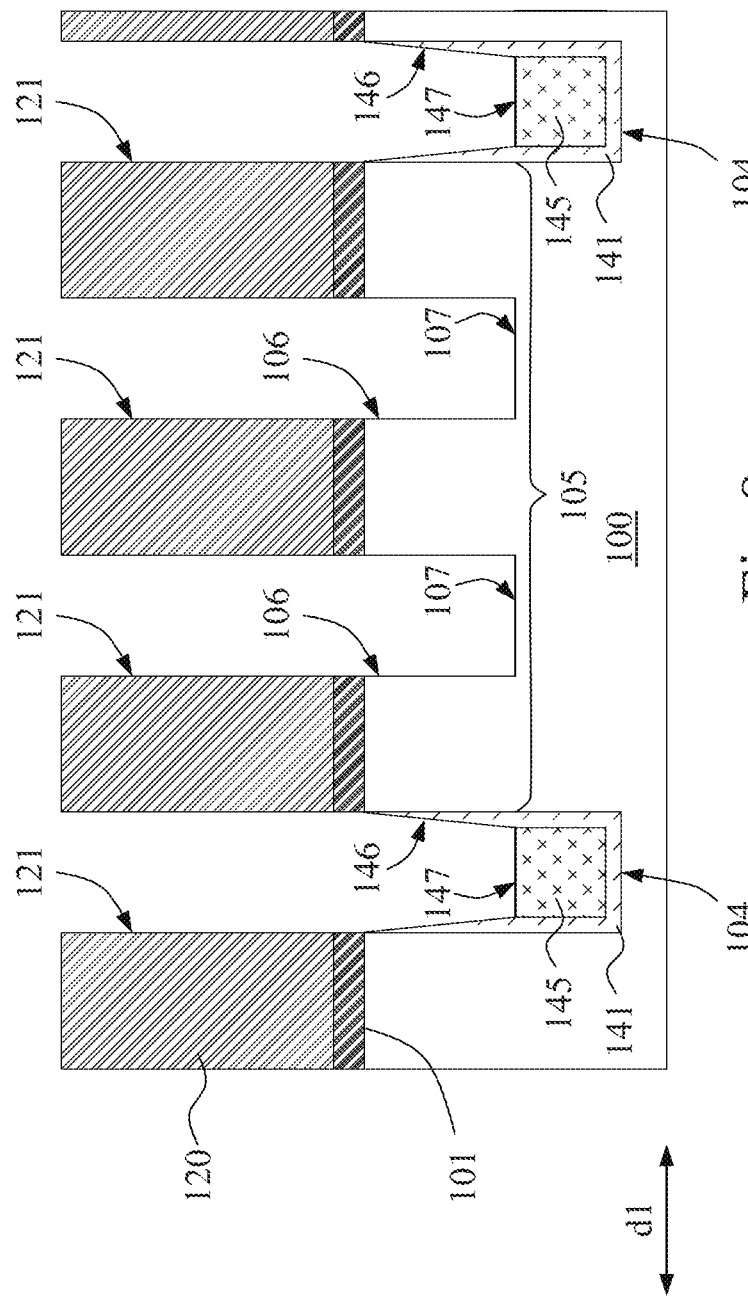

Please refer to FIG. 8. The manufacturing method of the present disclosure etches a plurality of first trenches 106 in the silicon substrate 100 along the second direction d2 as shown in FIG. 2, and the manufacturing method etches the nitride structures 140 into a plurality of nitride pillars 145.

The etching process forms a nitride opening 146 on every nitride pillar 145. Also, the oxide layer 141 besides the nitride opening 146 tapers from top surface 147 of the nitride pillar 145 to carrier surface 101 of the silicon substrate 100.

On the other hand, the top surfaces 147 of the nitride pillar 145 and the bottom surface 107 of the first trenches 106 are substantially aligned.

Figure 9:
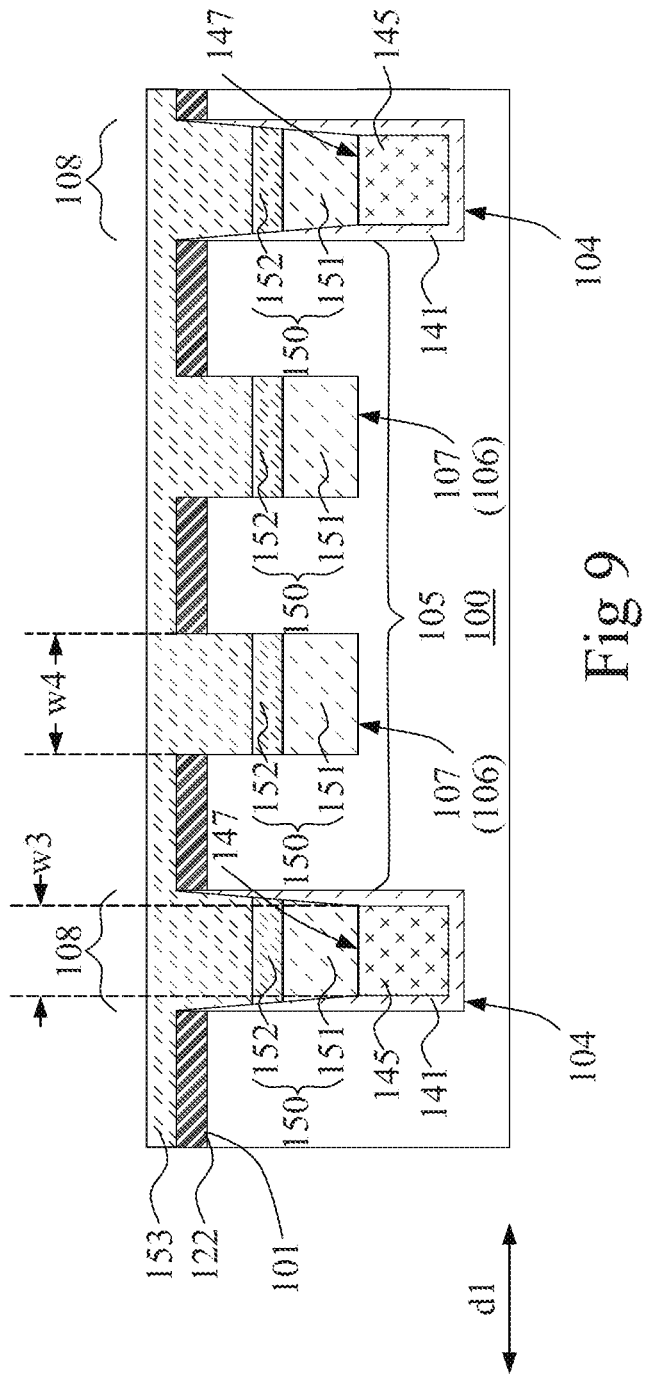
Figure 10:
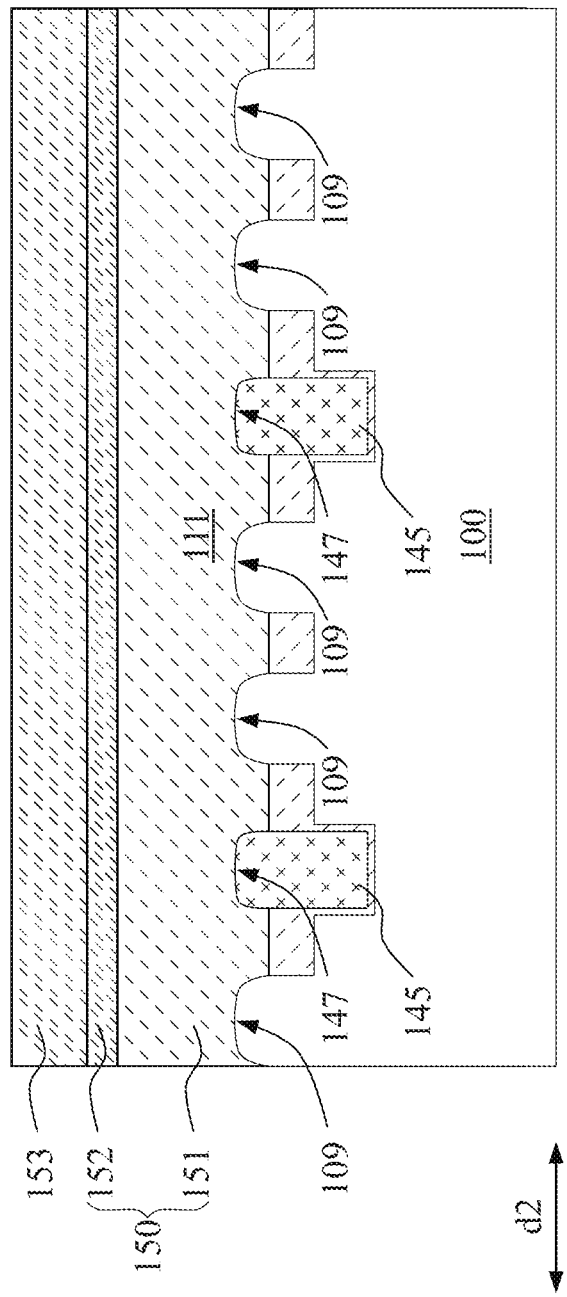

Please refer to FIG. 9. The manufacturing method of the present disclosure disposes a plurality of buried word lines 150. Some of the buried word lines 150 are located in the first trenches 106 respectively and the rest of the buried word lines 150 are located above the nitride pillars 145 respectively, and a semiconductor structure 200 of the embodiment is formed.

In the embodiment, the buried word lines 150 are buried in the silicon substrate 100, and the active area 105 and the isolating areas 108 are located on the carrier surface 101. The nitride pillars 145 are disposed in the isolating areas 108 respectively. Also, the active area 105 and the isolating areas 108 are arranged along the first direction d1.

Furthermore, the top surfaces 147 of the nitride pillars 145 are aligned with bottom surfaces 107 of the buried word lines 150 in the active areas 105, but the disclosure is not limited thereto. In some embodiment of the present disclosure, the buried word line 150 has a height in a range from about 70 nm to 90 nm, and the nitride pillar 145 has a height in a range from about 160 nm to 190 nm.

In the first direction d1, width w3 of the nitride pillar 145 is smaller than width w4 of the buried word line 150 in the active area 105. Also, width w3 of the bottom surface 107 of the buried word line 150 above the nitride pillar 145 is smaller than width w4 of the buried word line 150 in the active area 105. Therefore, the buried word line 150 of the embodiment can further reduce word line disturbance in the semiconductor structure 200.

Please refer to FIG. 10. In each of the buried word lines 150, top surface 147 of the nitride pillars 145 are aligned with top surfaces 109 of the silicon substrate 100. To be specific, shape of the nitride pillars 145 and shape of the silicon substrate 100 in the buried word line 150 may remain a fin shape, and provides saddle benefit, and keep saddle fin to increase channel width & lower W volume to improve Gate-Induced Drain Leakage (GIDL).

Please refer to both FIG. 9 and FIG. 10. The buried word lines 150 may include a conductive layer 151 and a conductive layer 152. To be specific, material of the conductive layer 151 may include tungsten, and material of the conductive layer 152 may include poly-Si. Furthermore, a nitride layer 153 is disposed on the conductive layer 152 and also covers the etch hard mask layer 122. However, an oxide layer can be further disposed on the nitride layer 153, but the disclosure is not limited thereto.

As seen above, in semiconductor structure of the embodiments of the present disclosure, word line disturbance may be reduced by the nitride pillars under the buried word lines. The manufacturing method of the embodiment of the present disclosure can provide a semiconductor structure without word line disturbance.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A semiconductor structure, comprising:
   a silicon substrate having a carrier surface;
   a plurality of buried word lines buried in the silicon substrate;
   a plurality of active areas located on the carrier surface;
   a plurality of isolating areas located on the carrier surface; and
   a plurality of nitride pillars disposed in the isolating areas respectively,
   wherein the active areas and the isolating areas are arranged along a first direction, and the buried word lines are extended along a second direction, and the nitride pillars are located below the buried word lines in the isolating areas, and top surfaces of the nitride pillars are aligned with bottom surfaces of the buried word lines in each of the active area.

2. The semiconductor structure of claim 1, wherein, in the first direction, width of each of the nitride pillar is smaller than width of each of the buried word line in the active area.

3. The semiconductor structure of claim 1, wherein, in the first direction, width of bottom surface of the buried word lines above the nitride pillars is smaller than width of the buried word lines in the active areas.

4. The semiconductor structure of claim 1, wherein, in each of the buried word lines, top surfaces of the nitride pillars are aligned with top surface of the silicon substrate.

5. A manufacturing method of semiconductor structure, comprising:

etching a plurality of second trenches on a carrier surface of a silicon substrate along a second direction;

disposing an oxide layer in the second trenches in conformal manner;

disposing a plurality of nitride structures in the second trenches respectively, wherein disposing the oxide layer is performed before disposing the nitride structures;

etching a plurality of first trenches on the silicon substrate along the second direction and etching the nitride structures into a plurality of nitride pillars; and disposing a plurality of buried word lines, wherein some of the buried word lines are located in the first trenches respectively and rest of the buried word lines are located above the nitride pillars respectively.

6. The manufacturing method of claim 5, wherein the step of disposing the nitride structures comprises:

disposing a plurality of nitride strips extending along a first direction; and etching the nitride strips into the nitride structures using a first hard mask, wherein the first hard mask exposes the second trenches.

7. The manufacturing method of claim 5, wherein bottom surface of the first trenches on the silicon substrate and top surfaces of the nitride pillars are aligned.

8. The manufacturing method of claim 5, wherein top surfaces of the nitride structures are aligned with the carrier surface of the silicon substrate.

* * * * *